United States Patent
Hellberg (10) Patent No.: US 6,774,717 B2
(45) Date of Patent: Aug. 10, 2004

(54) TRANSMITTER INCLUDING A COMPOSITE AMPLIFIER

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/336,897

(22) Filed: Jan. 6, 2003

(65) Prior Publication Data

US 2004/0051583 A1 Mar. 18, 2004

Related U.S. Application Data

(63) Continuation of application No. PCT/SE01/01392, filed on Jun. 19, 2001.

(30) Foreign Application Priority Data

Jul. 7, 2000 (SE) .............................................. 0002584
Jan. 10, 2001 (SE) .............................................. 0100063

(51) Int. Cl.[7] .............................. H03F 3/68; H03F 1/30
(52) U.S. Cl. .................................... 330/124 R; 330/144
(58) Field of Search .............................. 330/124 R, 144

(56) References Cited

U.S. PATENT DOCUMENTS

| | | | | |
|---|---|---|---|---|
| 5,880,633 A | * | 3/1999 | Leizerovich et al. | .......... 330/84 |
| 6,008,694 A | | 12/1999 | El-Sharawy | |
| 6,085,074 A | | 7/2000 | Cygan | |
| 6,097,252 A | | 8/2000 | Sigmon et al. | |
| 6,128,478 A | | 10/2000 | Kim | |
| 6,396,341 B1 | * | 5/2002 | Pehlke | .......... 330/10 |
| 6,639,464 B2 | * | 10/2003 | Hellberg | .......... 330/124 R |

\* cited by examiner

Primary Examiner—Patricia Nguyen
(74) Attorney, Agent, or Firm—Nixon & Vanderhye P.C.

(57) ABSTRACT

A composite amplifier includes a main power amplifier (10) and an auxiliary power amplifier (12), which are connected to a load (14) over a Doherty output network (16). Filters (26, 28) are provided for pre-filtering the amplifier input signals in such a way that the signals meeting at the output of the main amplifier have essentially the same frequency dependence.

12 Claims, 11 Drawing Sheets

TRANSMITTER INCLUDING A COMPOSITE AMPLIFIER

This application is a continuation of Application No. PCT/SE01/01392, filed 19 Jun. 2001, the entire content of which is hereby incorporated by reference in this application.

TECHNICAL FIELD

The present invention relates to a composite amplifier of the type that includes a main power amplifier and an auxiliary power amplifier, which are connected to a load over a Doherty output network. The invention also relates to a transmitter including such an amplifier and methods for operating such an amplifier and transmitter, respectively.

BACKGROUND

In cellular base stations, satellite communications and other communications and broadcast systems, many radio frequency (RF) carriers, spread over a large bandwidth, are amplified simultaneously in the same power amplifier. For the power amplifier this has the effect that the instantaneous transmit power will vary very widely and very rapidly. This is because the sum of many independent RF carriers (i.e. a multi-carrier signal) tends to have a large peak-to-average power ratio. It also tends to have a similar amplitude distribution as bandpass filtered Gaussian noise, which has a Rayleigh distribution.

A main difficulty in a power amplifier is efficiency. A conventional class B power amplifier exhibits maximum DC to RF power conversion efficiency when it delivers its peak power to the load. Since the quasi-Rayleigh distribution of amplitudes in the summed transmit signal implies a large difference between the average power and the peak power, the overall efficiency when amplifying such a signal in a conventional class B amplifier is very low. For a quasi-Rayleigh distributed signal with a 10 dB peak-to-average power ratio, the efficiency of an ideal class B amplifier is only 28%, see [1].

One way of increasing the efficiently of an RF power amplifier is to use the Doherty principle [1, 2, 3]. The Doherty amplifier uses in its basic form two amplifier stages, a main and an auxiliary amplifier (also called carrier and peaking amplifier, respectively). The load is connected to the auxiliary amplifier, and the main amplifier is connected to the load through an impedance-inverter, usually a quarter wavelength transmission line or an equivalent lumped network.

At low output levels only the main amplifier is active, and the auxiliary amplifier is shut off. In this region, the main amplifier sees a higher (transformed) load impedance than the impedance at peak power, which increases its efficiency in this region. When the output level climbs over the so-called transition point (usually at half the maximum output voltage), the auxiliary amplifier becomes active, driving current into the load. Through the impedance-inverting action of the quarter wavelength transmission line, this decreases the effective impedance at the output of the main amplifier, such that the main amplifier is kept at a constant (peak) voltage above the transition point. Th result is a substantially linear output to input power relationship, with a significantly higher efficiently than a traditional amplifier.

The transition point can be shifted, so that the auxiliary amplifier kicks in a a lower or higher power level. This can be used for increasing efficiency for a specific type of signal or a specific amplitude distribution. When the transition point is shifted, the power division between the amplifier at peak power is shifted accordingly, and the average power loss in each amplifier also changes. The latter effect also depends on the specific amplitude distribution.

An important feature of Doherty amplifiers is that they are inherently band-limited, since the impedance inverting network only provides 90 degrees of phase shift at a single frequency. This has the effect that the Doherty principle, i.e. the suppression of RF voltage rise at the main amplifier above a certain transition point, works poorly (inefficiently) outside a limited frequency band. This is because the suppression requires the voltages from the main amplifier and the auxiliary amplifier to be in perfect anti-phase at the output of the main amplifier. Since the quarter-wave network is really only a quarter wave (90 degrees) phase shift at the center frequency, and shorter or longer at frequencies below and above the center frequency, respectively, this requirement gets more and more violated the further one gets from the center frequency of the impedance inverter.

SUMMARY

An object of the present invention is to enhance efficiency of a composite amplifier provided with a Doherty output network. Preferably the efficiency is increased over a broader frequency band.

The stated object is achieved in accordance with the attached claims.

Briefly, the present invention enhances efficiency by separately pre-filtering the input signals to the power amplifiers in such a way that the signals meeting at the output of the main amplifier have the same frequency dependence. Preferably this is done by using filters representing the inverses of the frequency dependent power amplifier impedance and transimpedance, thereby flattening the frequency response of the composite amplifier over a broader frequency band.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
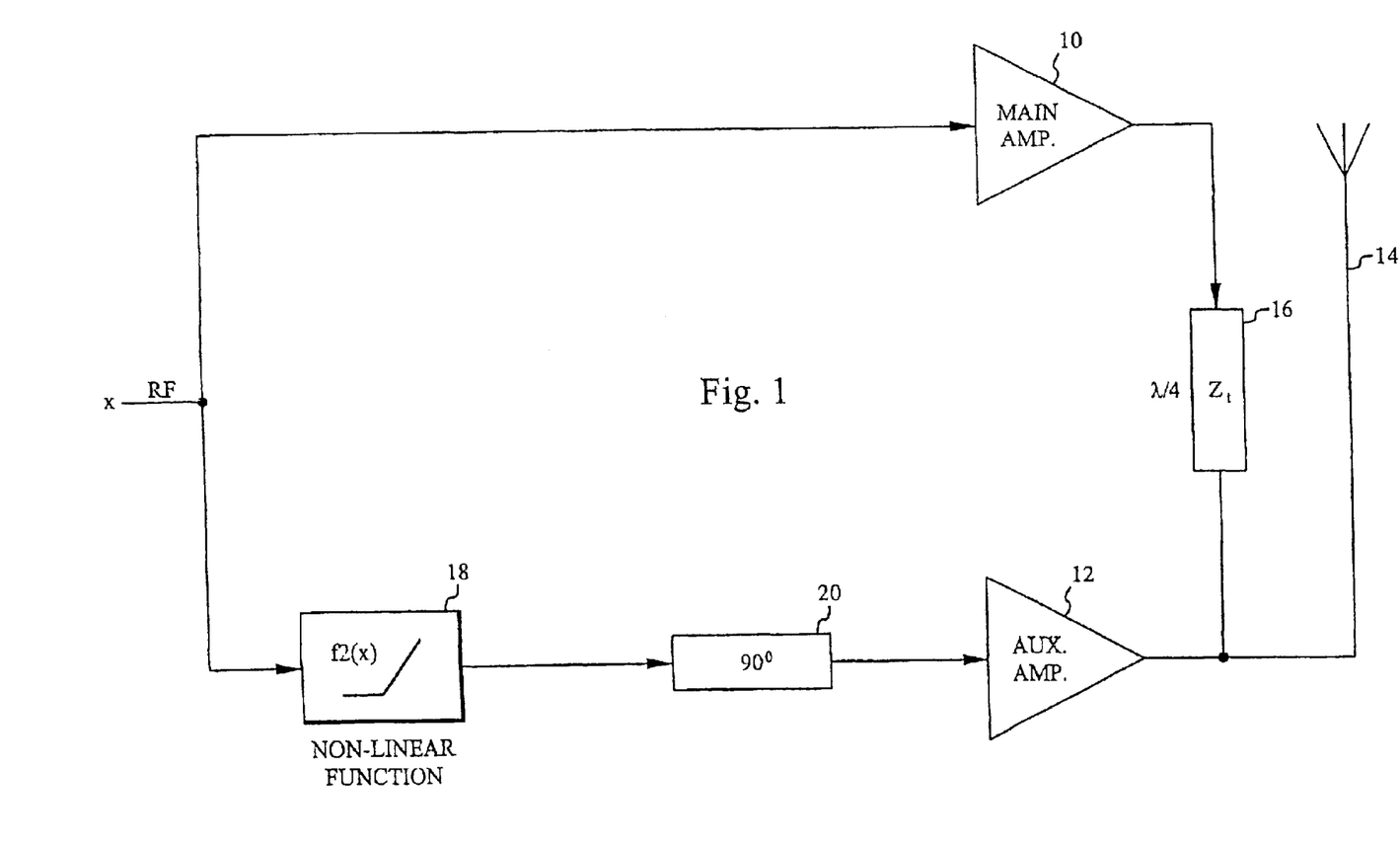
FIG. 1 is a simplified block diagram of a Doherty amplifier.

FIG. 1 is a simplified block diagram of a Doherty amplifier. It includes a main power amplifier 10 and an auxiliary power amplifier 12. The output of auxiliary amplifier 12 is connected directly to a load (antenna) 14, whereas the output of main amplifier 10 is connected to the output of auxiliary amplifier 12 over a Doherty output network including a quarter wavelength transmission line 16. On the input side an RF (Radio Frequency) input signal x is divided into two branches, one branch intended for main amplifier 10 and another branch for auxiliary amplifier 12. The auxiliary amplifier branch includes a non-linear function block 18, which transforms input signal x into f2(x), and a phase shifter 20, which shifts the input signal to auxiliary amplifier 12 by 90 degrees. As indicated by antenna 14 the composite amplifier may be part of a transmitter, for example a transmitter in a base station in a cellular mobile radio communication system.

Figure 2:
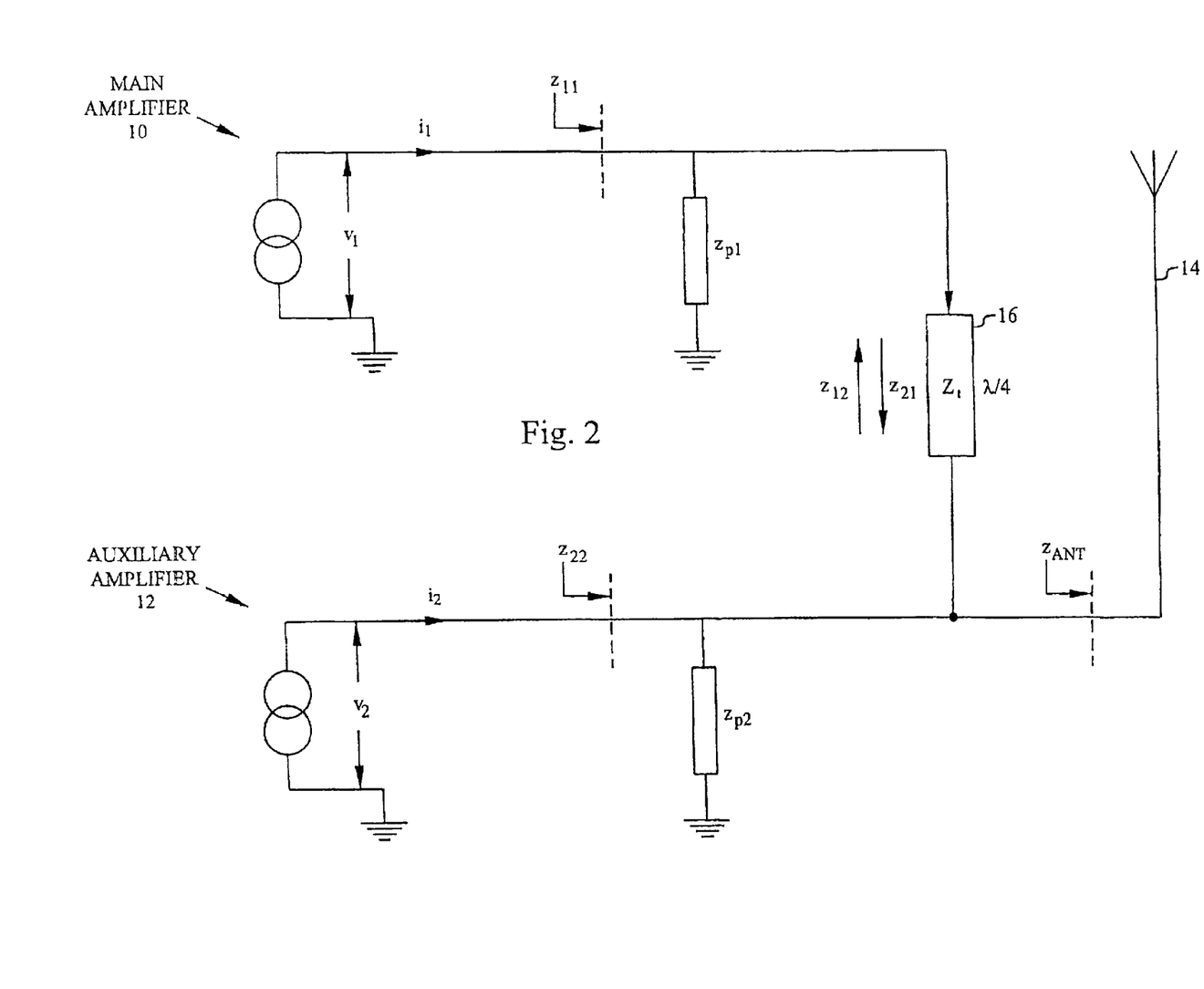
FIG. 2 is a model of the output network of a Doherty amplifier.

FIG. 2 is a model of the output network of a Doherty amplifier. In this model the active part of the amplifier transistor outputs are modeled as linear controlled current generators. The finite output conductances of the transistors, together with possible reactances, are lumped together as $z_{p1}$ and $z_{p2}$, respectively. The impedances presented to each current generator output node are defined as:

$$z_{11} = \frac{v_1}{i_1}\bigg|_{i_2=0} \quad z_{22} = \frac{v_2}{i_2}\bigg|_{i_1=0}$$

Similarly, the transimpedances, i.e. the voltage at the inactive amplifier output in response to an output current at the active amplifier, are defined as:

$$z_{21} = \frac{v_2}{i_1}\bigg|_{i_2=0} \quad z_{12} = \frac{v_1}{i_2}\bigg|_{i_1=0}$$

Assuming that all components are reasonably linear, superposition can be used for analyzing this model. The composite amplifier output voltage (at the antenna) is here assumed to be the same as the output voltage at auxiliary amplifier 12, although in reality there can be a feeder cable, filters, etc. separating the actual antenna and the amplifier output. The combined effect of all these elements is included in the antenna (output) impedance, $z_{ant}$.

Figure 3:
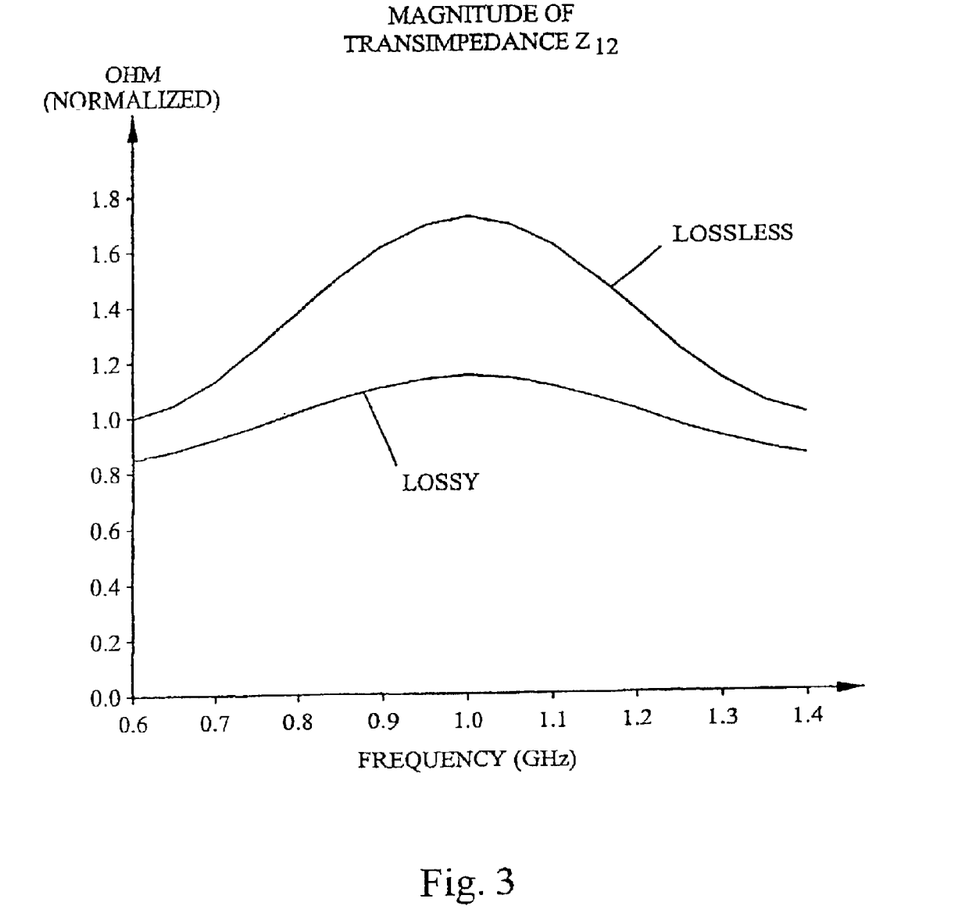
FIG. 3 is a diagram illustrating the frequency dependence of the trans-impedance between the auxiliary and amplifier.

In an ideal lossless Doherty amplifier the impedance $z_{11}$ and the transimpedance $z_{12}$ are both affected by a frequency-dependent reactive part due to the quarter-wave transformer, which is only a perfect quarter wavelength at a single frequency, as well as reactive components of $z_{p1}$, $z_{p2}$ and $z_{ANT}$. However, the impedance $z_{11}$ and the transimpendance $z_{12}$ are also affected by losses due to the fact that the magnitude of the voltage at the opposite terminal is lowered for a given current stimulus. The frequency dependance of transimpedance $z_{12}$ is illustrated in FIG. 3 for both the lossless and lossy case (in FIG. 3 the design frequency is 1 GHz). The impedance $z_{11}$ would have a qualitatively similar frequency dependance.

Since the primary function of auxiliary amplifier 12 in a Doherty amplifier is to keep the voltage at main amplifier 10 below saturation, the frequency dependance of all signals at the output P of main amplifier 10 should be the same. Thus, the output signal from amplifier 10 and the transformed (by z1) output signal from auxiliary amplifier 12, which meets the output signal from main amplifier 10 at P and keeps amplifier 10 below saturation, should have the same frequency dependance, and this frequency dependance should preferably be as flat as possible. The output P is located right at the power amplifier transistor collector. This can be achieved by pre-filtering the input signals to amplifiers 10 and 12 in such a way that the combined filtering actions of impedance and transimpedance is the same for both signals at output P.

Figure 4:
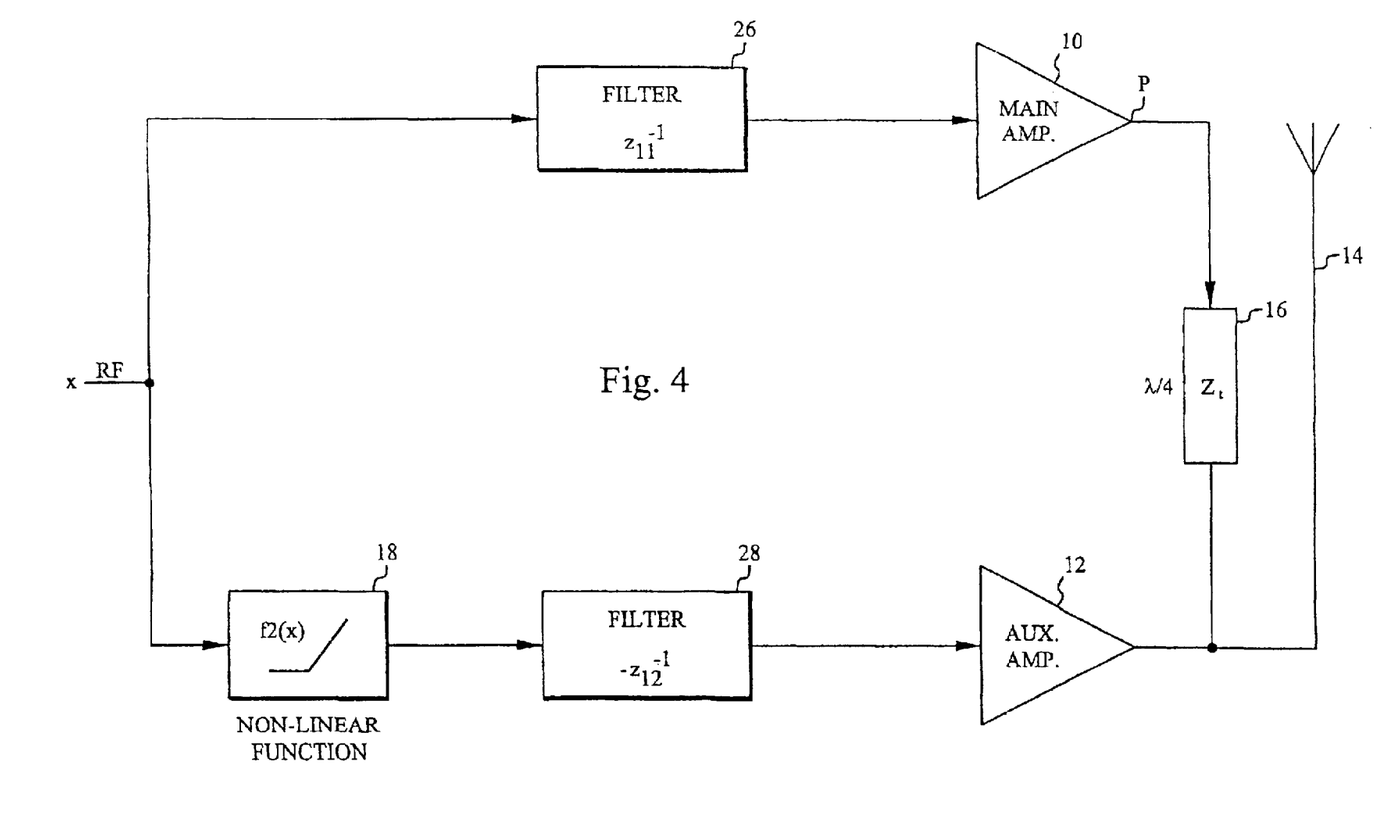
FIG. 4 is a simplified block diagram of an exemplary embodiment of the composite amplifier in accordance with the present invention.

FIG. 4 illustrates an exemplary embodiment of the present invention achieves this result. In this embodiment the frequency dependance of the output signal from main amplifier 10 is eliminated by filtering the input signal with a filter having the frequency characteristics of $z_{11}^{-1}$, the inverse filter of the impedance seen at the output of main amplifier 10. Similarly, an equalization of the transformed output signal from auxiliary amplifier 12 may obtained by filtering its input with a filter having the frequency characteristics of $z_{11}^{-1}$, the inverse filter of the transimpedance between auxiliary amplifier 12 and main amplifier 10. The terms $z_{11}^{-1}$ and $z_{12}^{-1}$ are, when observed in the frequency domain, equal to $1/z_{11}$ and $1/z_{12}$, respectively.

The analytical expressions for obtaining $i_1$ and $i_2$ may be expressed as:

$$i_1 = \frac{V_{max}}{\alpha} z_{11}^{-1} * x$$

$$i_2 = -V_{max} z_{12}^{-1} * f2(x)$$

where f2(x) is a function that is 0 up to the transition point $\alpha$, and thereafter has the same slope as x, as illustrated in block 18.

If the dimensionless signals f2(x) and x are represented in the time domain, "*" represent convolution in the time domain. If they are represented in the frequency domain, the symbol instead represents multiplication of frequency responses, and the multiplication with inverse filters can be written as a division by the filter instead. The derived network model is shown in FIG. 4. Filters 26 and 28 may thus be represented by:

$$\text{Filter 26:} \quad \frac{V_{max}}{\alpha} z_{11}^{-1}$$

$$\text{Filter 28:} \quad -V_{max} z_{12}^{-1}$$

So far only the optimization of the voltage at the output P of main amplifier 10 has been studied, and expressions for the optimal currents have been derived. The voltage amplitude at auxiliary amplifier 12 has been left out of the discussion. This is partly because a fixed hardware setup has been assumed, i.e. the impedance of the quarter wave line and the load has been assumed fixed. For a lossless system this is not a serious problem, the effect of optimizing for flat response and optimal amplitude at main amplifier 10 is that the output signal gets a slight frequency dependence. When losses are considered, however, the effect can be that the maximum voltage at auxiliary amplifier 12 never Vmax, even at maximum input levels. This constitutes a more serious problem, since the transistors then deliver less than the maximum power to the load (at peak output), while still having the same supply voltage, and the efficiently will drop. The simple solution is to either reduce the supply voltage, or to increase the load impedance until maximum voltage is achieved at peak output (the latter solution is preferred, since this scheme gives higher efficiency and more valuable output power). The compensation for losses can also have the effect that neither transistor reaches Imax, which also implies an under-utilization of the transistors. Impedances (load and quarter-wave line) may then have to be changed in order to use the maximum possible output power from the transistors. Equally important is to keep both transistors in the safe region, so that the maximum currents and voltages are reached but not exceeded. Not that when changing the impedances in the circuit, redesign of the compensations according to the depicted scheme is necessary. Also, if maximum power is not a design goal, the circuit can be optimized differently, to meet other objectives.

Figure 5:
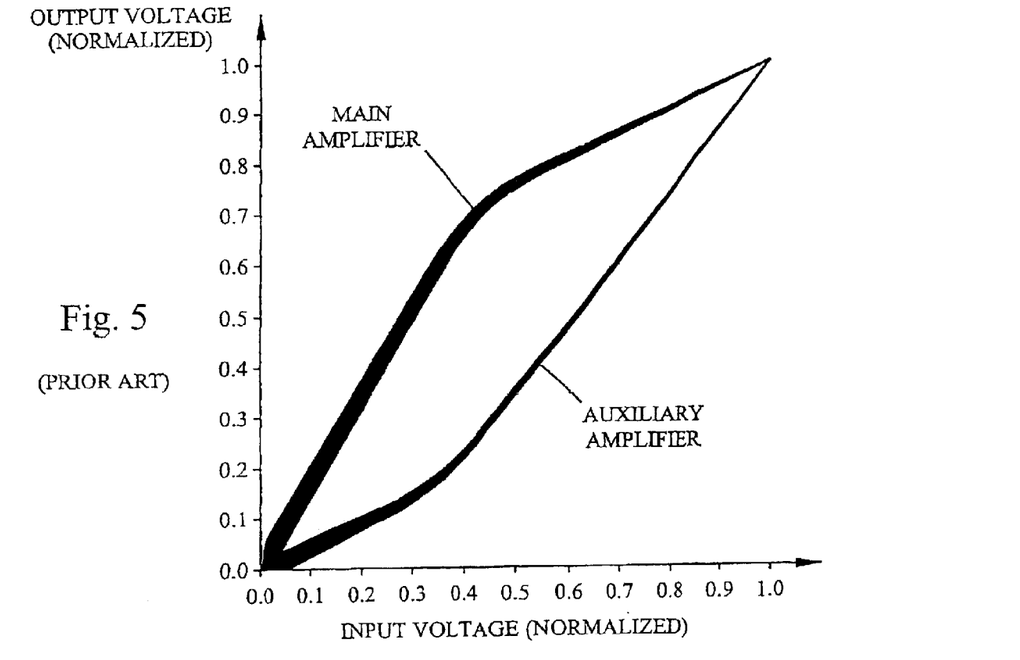
FIG. 5 is a diagram illustrating the input-output voltage characteristics of a prior art Doherty amplifier.
Figure 6:
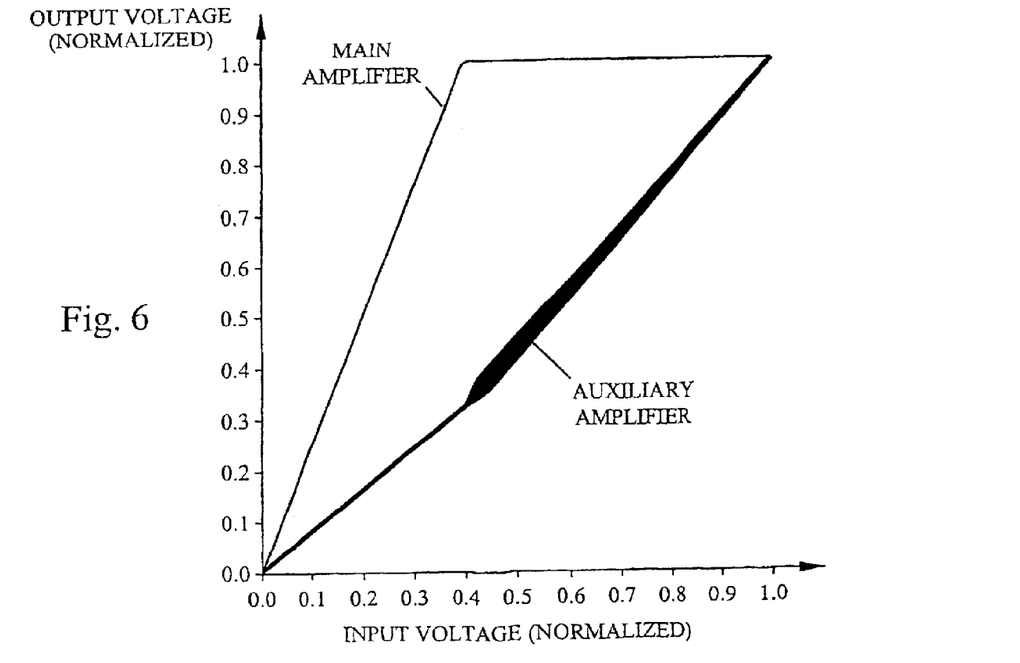
FIG. 6 is a diagram illustrating the output-input voltage characteristics of a composite amplifier in accordance with the embodiment of FIG. 4.

The effect of the compensation in accordance with the embodiment of FIG. 4 is illustrated in FIGS. 5 and 6 with reference to a simulated example with a multi-carrier signal.

In FIG. 5 the normalized magnitudes of the voltages at main amplifier 10 and auxiliary amplifier 12 are plotted against the desired magnitude (the normalized amplitude of x) for the uncompensated case (prior art). The drive signals have been adjusted to keep both voltages within the liner (unsaturated) range of the transistors. The different slopes of the output signal (voltage at auxiliary amplifier 12) below and above the transition point indicate a static non-linearity. The different widths of these curves indicate a level-variant frequency dependance. The voltage at main amplifier 10 is not at all close to the desired constant level above the transition point, which means that the average efficiency will be low (although still probably better than for a class B amplifier).

The normalized magnitudes of the voltages at main amplifier 10 and auxiliary amplifier 12 after efficiency-boosting in accordance with the embodiment of FIG. 4 are illustrated in FIG. 6. Compensation of the network for losses has been performed by changing the transmission line impedance and the load impedance.

Figure 7:
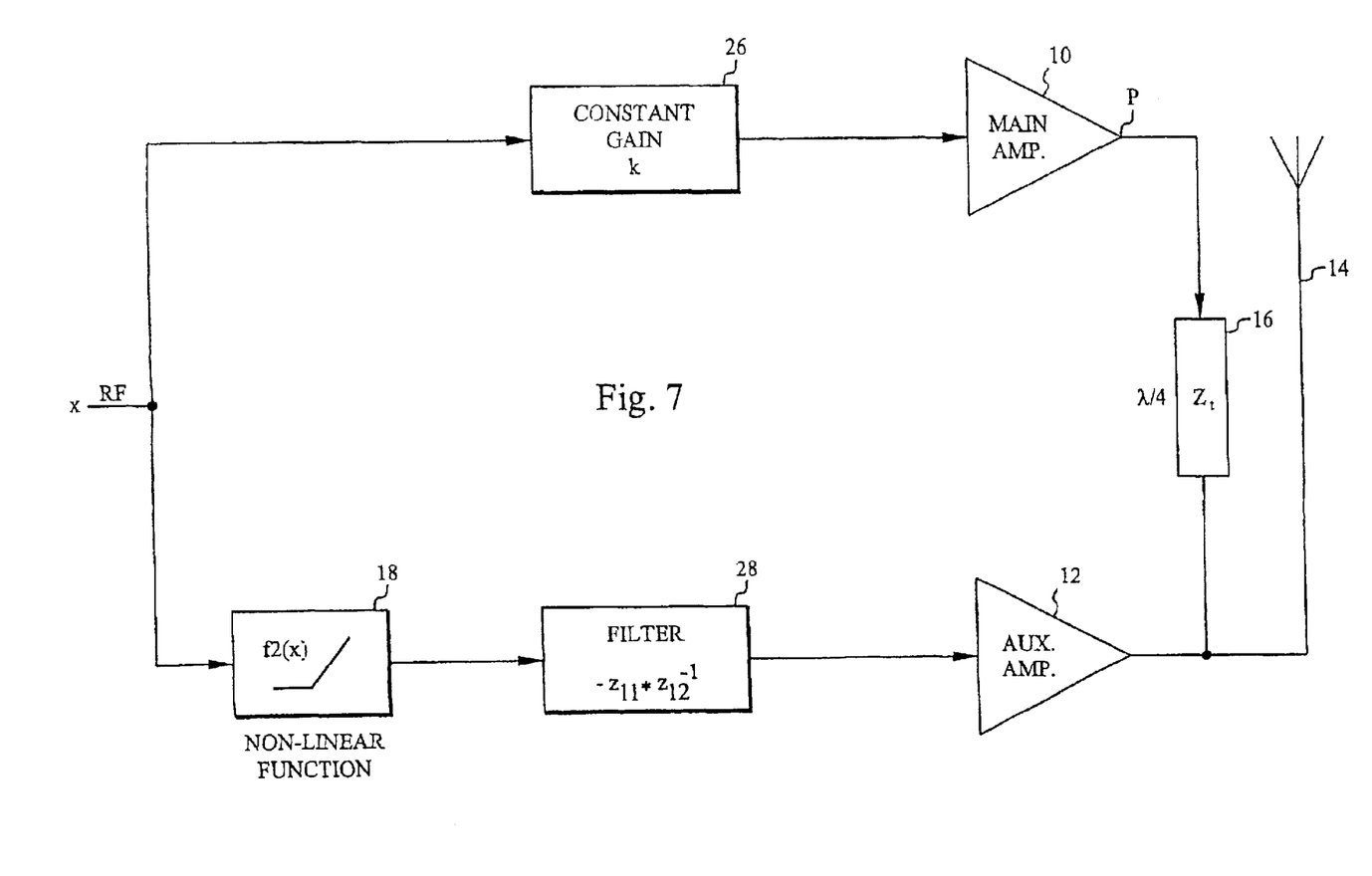
FIG. 7 is a simplified block diagram of another exemplary embodiment of the composite amplifier in accordance with the present invention.
Figure 8:
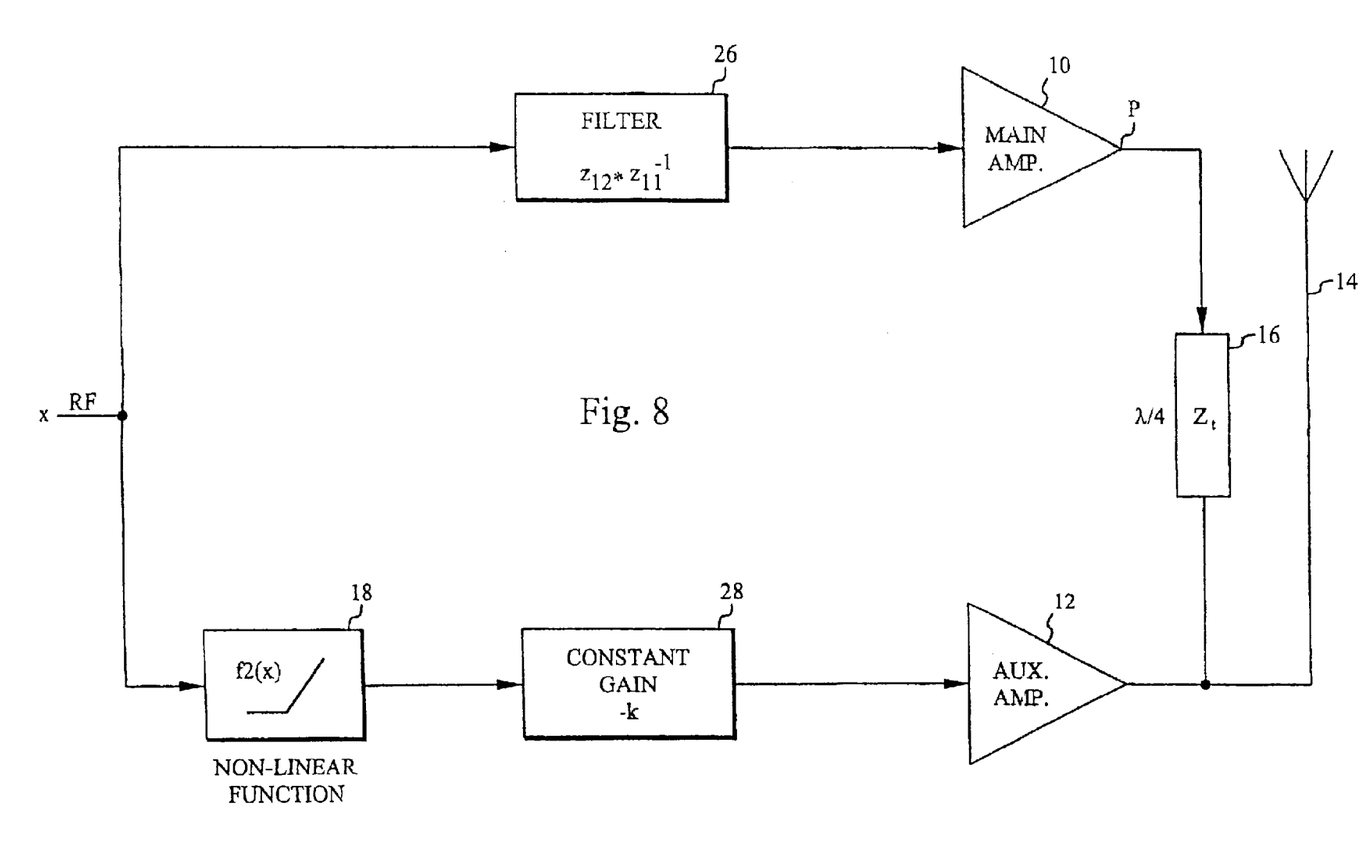
FIG. 8 is a simplified block diagram of still another exemplary embodiment of the composite amplifier in accordance with the present invention.

In the embodiment described with reference to FIG. 4, the frequency dependence of the two signals meeting at output P was eliminated by equalizing filters on the input side. However, equalization is not strictly necessary from an efficiency-boosting viewpoint. Instead the essential feature is that both signals have the same frequency dependence. There are other ways to accomplish this. Two examples are illustrated in FIGS. 7 and 8. In both examples only one input signal is subjected to actual filtering, while the other input signal is only resealed by a constant gain.

In the embodiment of FIG. 7 the auxiliary amplifier branch is equalized by $z_{12}^{-1}$ and then filtered by $z_{11}$ to obtain the same frequency dependence as the main amplifier branch, which is only adjusted by a constant gain. Thus filters 26 and 28 are:

$$\text{Filter 26: } \frac{V_{max} \cdot k}{\alpha}$$

$$\text{Filter 28: } -V_{max} \cdot k \cdot z_{11} * z_{12}^{-1}$$

where k is a constant that is selected to make the voltage at the output node of main amplifier 10 equal to $V_{max}$.

In the embodiment of FIG. 8 the main amplifier branch is equalized by $z_{11}^{-1}$ and then filtered by $z_{12}$ to obtain the same frequency dependence as the auxiliary amplifier branch, which is only adjusted by a constant gain. Thus filters 26 and 28 are:

$$\text{Filter 26: } \frac{V_{max} \cdot k}{\alpha} z_{12} * z_{11}^{-1}$$

$$\text{Filter 28: } -V_{max} \cdot k$$

Figure 9:
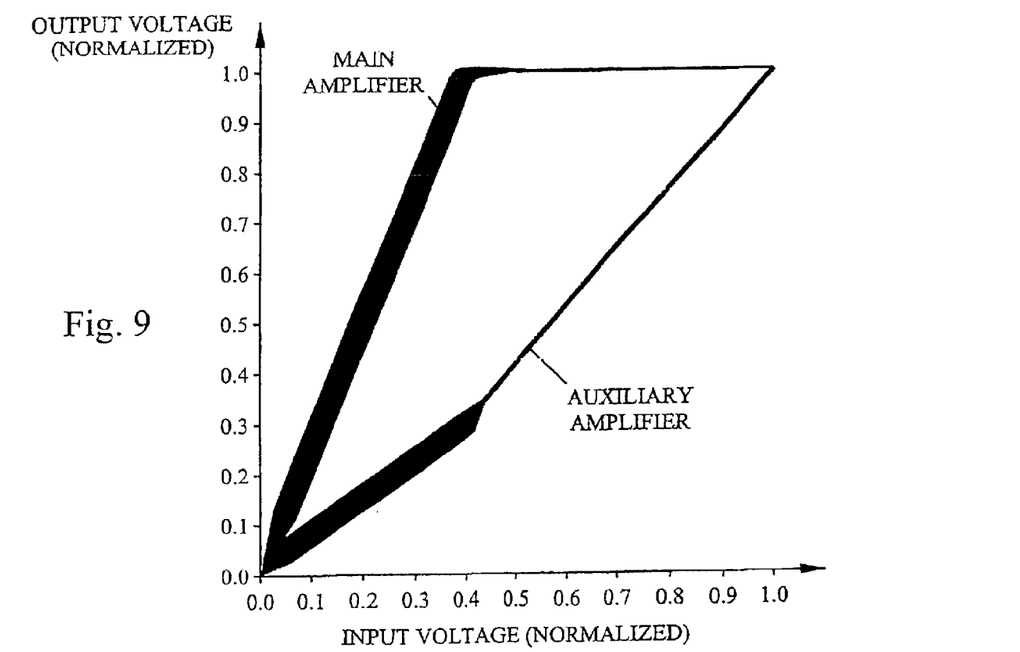
FIG. 9 is a diagram illustrating the output-input voltage characteristics of a composite amplifier in accordance with the embodiment of FIG. 7.
Figure 10:
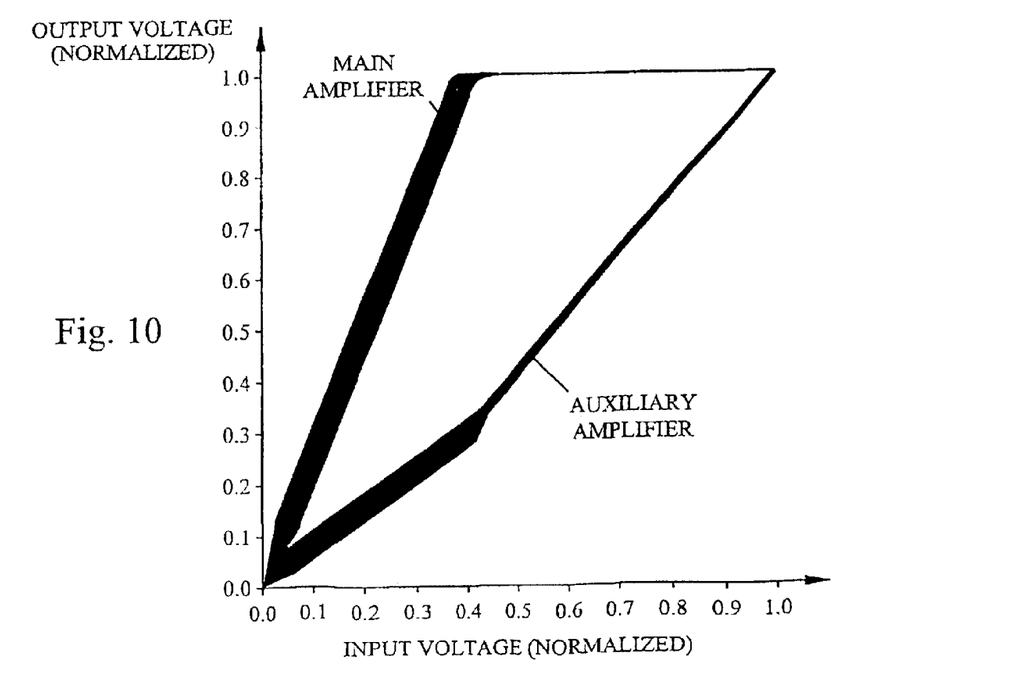
FIG. 10 is a diagram illustrating the input-output voltage characteristics of a composite amplifier in accordance with the embodiment of FIG. 8.

FIGS. 9 and 10 illustrate the input-output voltage characteristics of the embodiments of FIGS. 7 and 8, respectively. As can be seen from these figures, the voltage at main amplifier 10 is close to the desired constant level above the transition point, which means that the average efficiency will br high. As expected, the lines are somewhat widened compared to FIG. 6 due to the reduced equalization.

Figure 11:
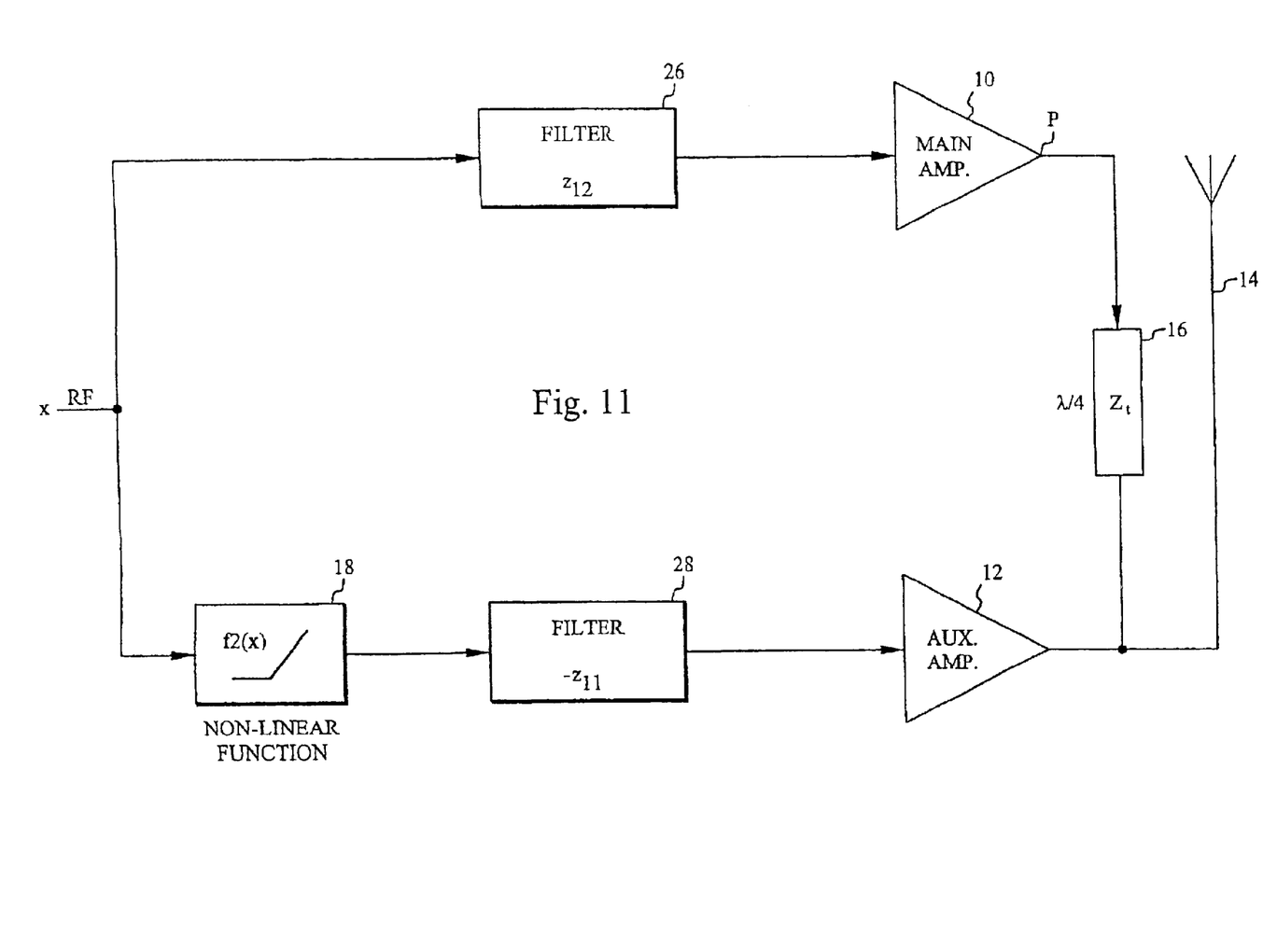
FIG. 11 is a simplified block diagram of a further exemplary embodiment of a composite amplifier in accordance with the present invention.

In the embodiments described with reference to FIGS. 7 and 8, the frequency dependence of the two signals meeting at output P was partly reduced by equalizing filters on the input side ($z_{12}^{-1}$ and $z_{11}^{-1}$, respectively). However, as noted above, equalization is not strictly necessary from an efficiency-boosting viewpoint. Thus, by considering only the essential feature that both signals should have the same frequency dependence, it is possible to eliminate inverse filters. An example is illustrated in FIG. 11. In this example both input branches include filters that emulate the filtering produced by the other branch, thereby subjecting each branch to the same total filter.

Thus, in the embodiment of FIG. 11 main amplifier branch is filtered by a filter having the frequency characteristics of $z_{11}$. Thus filters 26 and 28 are:

$$\text{Filter 26: } \frac{V_{max} \cdot k}{\alpha} z_{12}$$

$$\text{Filter 28: } -V_{max} \cdot k \cdot z_{11}$$

Figure 12:
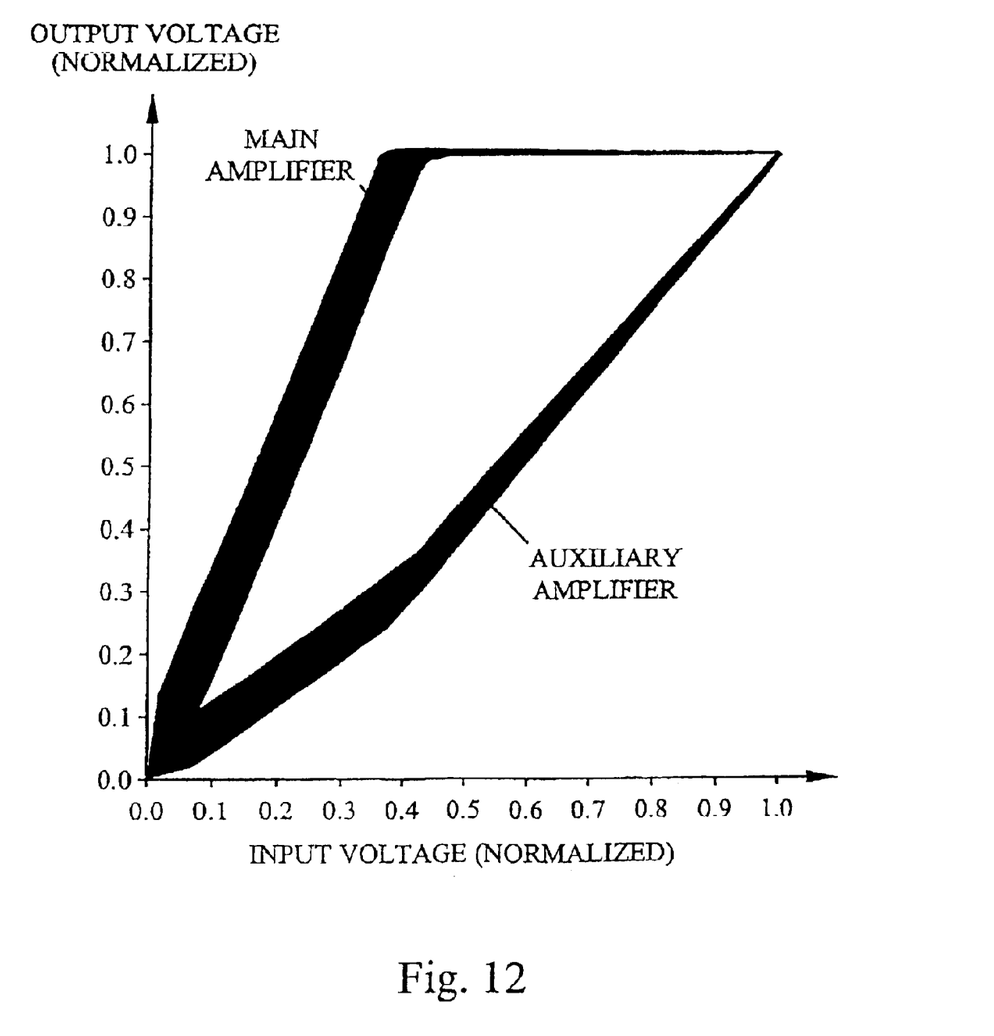
FIG. 12 is a diagram illustrating the output-input voltage characteristics of a composite amplifier in accordance with the embodiment of FIG. 11.

FIG. 12 illustrates the input-output voltage characteristics of the embodiment of FIG. 11. As can be seen from this figure, the voltage at main amplifier 10 is close to the desired constant level above the transition point, which means that the average efficiency will be high also in this embodiment. As expected, the lines are somewhat more widened compared to FIGS. 9 and 10 due to the eliminated equalization.

Figure 13:
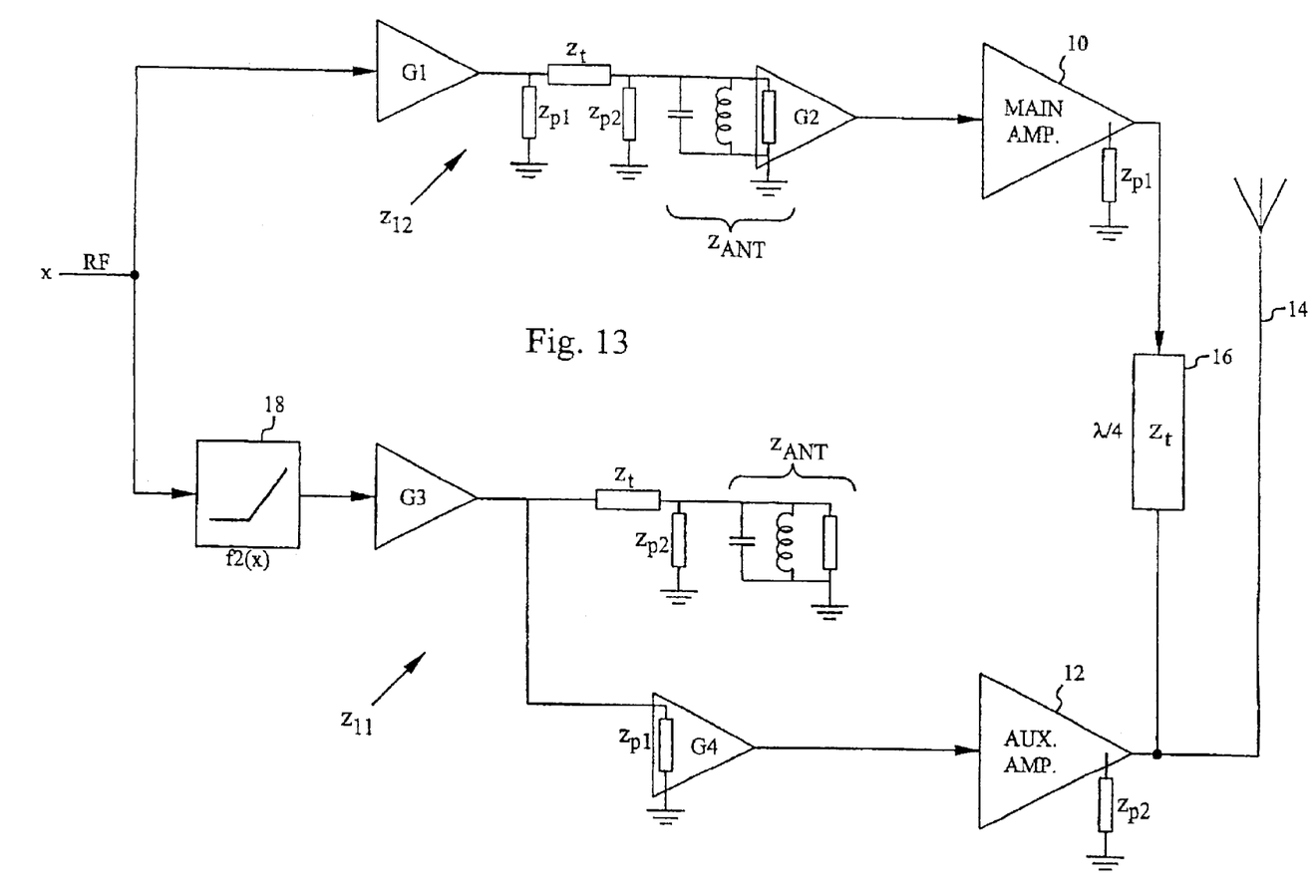
FIG. 13 is a block diagram of an exemplary implementation of the embodiment of FIG. 11.

FIG. 13 is a block diagram of an exemplary implementation of the embodiment of FIG. 11. A simple but elegant method for obtaining the filters $z_{11}$ and $z_{12}$ (the filtering by $z_{12}$ can be obtained by using $z_{21}$ instead) is to use input-side copies of the Doherty output network, containing the same passive circuit elements that are present in the actual output network. When such a network is driven by a current generator (small-signal transistor) on the input side, the output voltage automatically has the right frequency dependence. The requirement for this to work is that the transistor output parasitic elements, the quarter-wave line and the antenna network impedance can be accurately modeled. A possibility is to scale the impedance of all elements in the network to get more realizable values and/or better voltage and current levels.

If the non-linear function f2(x) of the RF signal is produced by a class C amplifier, it can also be produced by driving amplifier G3 in class C mode. The amplification to higher voltage is preferably done in the preamplifiers to main amplifier 10 and auxiliary amplifier 12. The antenna network impedance is in this case modeled by a 50 Ohm resistance with a parallel resonator tuned to the center frequency. Amplifier G3 is a controlled current generator. The input impedance of (identical) amplifiers G2 and G4 together with appropriate additional reactances emulate the antenna network impedance $Z_{ANT}$, and possible parasitics on the output of G3 are included in the corresponding $Z_{p2}$ and $Z_{p1}$. Amplifier G1 provides a matching gain to main amplifier 10. The power amplifiers include necessary input matching networks and preamplifiers.

In practice, the performance of the described methods will depend on how well the characteristics of the Doherty output network are known. Measuring transimpedances in the output network is often hard to do directly, since the (RF) voltage probe and the current injector will always have parasitics that (Z-parameters) can be extracted by traveling wave measurements (S-parameters). A combination of different parameters that are easy to measure can also be selected. The required filters or emulating networks can then be designed using extracted impedances and transimpedances.

The gain of the liner path to main amplifier 10 can be adjusted (at several frequencies to ensure amplitude flatness) by observing the starting point of compression in the output for a main. Compression should occur at a power corresponding to the transition point, if f2(x) is deactivated.

Optimal suppression of the voltage rise at main amplifier 10 above the transition point, requires phase and gain matching of the linear part to the non-linear part at this node. The phase matching, or electrical path length difference, should be sufficiently correct (within a fraction of a wavelength) before adjustment in order to avoid local minima at multiple wavelengths away from the correct one.

Probing the voltage at main amplifier 10 for flatness above the transition point, instead of just observing the efficiency, can help in achieving maximum efficiency. The probe must have high impedance to avoid increasing the losses or otherwise detrimentally affect the conditions in the circuit. Apart from that, the probe impedance can be incorporated in the efficiency-boosting compensations.

Many parameters of the output network and amplifiers are slowly changing, due to aging, temperature variations and other environmental changes. This means that the efficiency of the amplifier may degrade from its initial level.

To cope with this problem, the filters and gains in the network can be made to respond in real time to the parameter variations.

The adjustments described in the previous paragraphs can be automated by monitoring the output and possibly the voltage at main amplifier 10 and relate this to the signals inputted at various points in the network. The measured values can then be used for changing the parameters of the input network. An alternative is to insert special signals that are only used for measurements (pilot signals).

An entirely digital implementation of the efficiency-boosting techniques will have advantages over an analog implementation in that the filters will be more accessible to detailed adjustments. An analog implementation relies on the adjustments of circuit elements, but the circuit itself is hard to change during operation.

Since saturation is a somewhat vaguely defined state, with a transition region in which the power amplifier is neither a pure current source nor a hard-limited voltage source, solutions can be found in which a power amplifier is held slightly saturated over the "flat" voltage range. The methods proposed by the present invention can be used to control this amount of saturation very precisely so that efficiency is increased, over that of a strictly non-saturated amplifier, but the distortion does not grow above a set limit.

Many different implementations are possible. Digital or analog signal processing can be used, and the processing can be performed with a variety of techniques, at baseband, intermediate or final (RF) frequencies. Arbitrary combinations of these can be used, matching the requirements for a function with a convenient way of implementing it. The solution can be used statically, optimized at the time of manufacture or at specific times during maintenance, or dynamically adaptive, for continuously optimizing the efficiency of the amplifier.

It will be understood by those skilled in the art that various modifications and changes may be made to the present invention without departure from the scope thereof, which is defined by the appended claims.

REFERENCES

[1] F. H. Raab, "Efficiency of Doherty RF Power Amplifier Systems", IEEE Trans. Broadcasting, vol BC-3, no. 3, pp. 77–83, Sep. 1987

[2] U.S. Pat. No 5,420,541 (D. M. Upton et.al.).

[3] U.S. Pat. No. 5,568,086 (J. J. Schuss et. al.).

What is claimed is:

1. A composite amplifier including
    a main power amplifier;
    an auxiliary power amplifier, said amplifiers being connected to a load over a Doherty output network; and
    means for pre-filtering amplifier input signals in such a way that the signals meeting at the output of said main amplifier have essentially the same frequency dependence.

2. The composite amplifier of claim 1, including a pre-filter to said main amplifier having the same frequency dependence as the inverse of the impedance presented to the main amplifier current generator output node, and a pre-filter to said auxiliary amplifier having the same frequency dependence as the inverse of the transimpedance between said auxiliary amplifier and said main amplifier.

3. The composite amplifier of claim 1, including a pre-filter to said auxiliary amplifier having the same frequency dependence as a filter combination formed by the inverse of the impedance presented to the main amplifier current generator output node and the inverse of the transimpedance between said auxiliary amplifier and said main amplifier.

4. The composite amplifier of claim 1, including a pre-filter to said main amplifier having the same frequency dependence as a filter combination formed by the transimpedance between said auxiliary amplifier and said main amplifier and the inverse of the impedance presented to the main amplifier current generator output node.

5. The composite amplifier of claim 1, including a pre-filter to said main amplifier having the same frequency dependence as the transimpedance between said auxiliary amplifier and said main amplifier, and a pre-filter to said auxiliary amplifier having the same frequency dependence as the inverse of the impedance presented to the main amplifier current generator output node.

6. A transmitter with a composite amplifier including
    a main power amplifier;
    an auxiliary power amplifier, said amplifiers being connected to a load over a Doherty output network; and
    means for pre-filtering amplifier input signals in such a way that the signals meeting at the output of said main amplifier have essentially the same frequency dependence.

7. The transmitter of claim 6, including a pre-filter to said main amplifier having the same frequency dependence as the inverse of the inverse of the impedance presented to the main amplifier current generator output node, and a pre-filter to said auxiliary amplifier having the same frequency dependence as the inverse of the transimpedance between said auxiliary amplifier and said main amplifier.

8. The transmitter of claim 6, including a pre-filter to said auxiliary amplifier having the same frequency dependence as a filter combination formed by the inverse of the impedance presented to the main amplifier current generator output node and the inverse of the transimpedance between said auxiliary amplifier and said main amplifier.

9. The transmitter of claim 6, including a pre-filter to said main amplifier having the same frequency dependence as a filter combination formed by the transimpedance between said auxiliary amplifier and said main amplifier and the inverse of the impedance presented to the main amplifier current generator output node.

10. The transmitter of claim 6, including a pre-filter to said main amplifier having the same frequency dependence as the transimpedance between said auxiliary amplifier and said main amplifier, and a pre-filter to said auxiliary amplifier having the same frequency dependence as the inverse of the impedance presented to the main amplifier current generator output node.

11. A method of operating a composite amplifier including a main power amplifier and an auxiliary power amplifier, which are connected to a load over a Doherty output network, including the step of pre-filtering amplifier input signals in such a way that the signals meeting at the output of said main amplifier have essentially the same frequency dependence.

12. A method of operating a transmitter provided with a composite amplifier including a main power amplifier and an auxiliary power amplifier, which are connected to a load over a Doherty output network, including the step of pre-filtering amplifier input signals in such a way that the signals meeting at the output of said main amplifier have essentially the same frequency dependence.

* * * * *